US005604810A

United States Patent [19]

Yanagawa

[11] Patent Number: 5,604,810

[45] Date of Patent: Feb. 18, 1997

[54] SOUND FIELD CONTROL SYSTEM FOR A MULTI-SPEAKER SYSTEM

[75] Inventor: Hirofumi Yanagawa, Tokyo, Japan

[73] Assignee: Pioneer Electronic Corporation, Tokyo, Japan

[21] Appl. No.: 212,981

[22] Filed: Mar. 15, 1994

[30] Foreign Application Priority Data

Mar. 16, 1993 [JP] Japan .................................... 5-55571

[51] Int. Cl.[6] ........................................ H03G 3/00

[52] U.S. Cl. ................................ 381/63; 381/61; 84/630; 84/DIG. 26

[58] Field of Search ............................ 381/63, 61.2, 89, 381/93, 17, 18, 97, 98; 84/629, 630, 662, 7.7, DIG. 26

[56] References Cited

U.S. PATENT DOCUMENTS 4,955,057 9/1990 Tominari .................................. 381/63
5,025,472 6/1991 Shimizu et al. .......................... 381/63
5,036,541 7/1991 Kato ........................................ 381/62
5,109,419 4/1992 Griesinger ................................ 381/63
5,119,420 6/1992 Kato et al. ................................ 381/63
5,187,692 2/1993 Hangda et al. ........................... 381/17
5,241,604 8/1993 Noguchi .................................. 84/630

FOREIGN PATENT DOCUMENTS 2251417 4/1992 Japan ...................................... 381/63
4128896 4/1992 Japan ...................................... 381/63
4150200 5/1992 Japan ...................................... 381/17

*Primary Examiner*—Curtis Kuntz
*Assistant Examiner*—Xu Mei
*Attorney, Agent, or Firm*—Nikaido, Marmelstein, Murray & Oram LLP

[57] ABSTRACT

A plurality of reverberation signal generating circuits are provided for generating a plurality of reverberation signals from input audio signals of two channels. Each of the reverberation signals has a predetermined function of correlation. A pair of filters are provided for controlling the function of correlation of the reverberation signal and for applying controlled reverberation signals to reverberation speakers, thereby providing a sound field.

2 Claims, 5 Drawing Sheets

SOUND FIELD CONTROL SYSTEM FOR A MULTI-SPEAKER SYSTEM

BACKGROUND OF THE INVENTION

The present invention relates to a system for controlling a sound field for a multi-speaker system wherein an audio signal is reproduced for providing an effect as if the listener is in a concert hall.

The sound field control system renders it possible to provide a sound effect, in a home listening room, similar to that of a reflected sound environment such as a concert hall. More particularly, delayed audio signals corresponding to the reflected sound of the direct sound is added to the original audio signal representing an original direct sound, and the composite signal is reproduced by a multi-speaker system comprising four or more loudspeakers.

Referring to FIG. 6, in an example of the sound field control system, two main speakers a and b are disposed in front of a listener A for emitting the direct sound, and four speakers c to f are disposed in front and at the rear of the listener for emitting reflected sound. The listener A is thus able to sense a spacial impression of sound in regions B and C. More particularly, the reflected-sound speakers c and e reproduces delayed sound imitating an actually reflected sound which comes from a position g, as if in a hall. The delayed sound, in accordance with the principle of composition of vectors, is intended to cause the reflected sound to be localized at the position g. Similarly, the speakers d and f reproduces sounds reflecting from the opposite direction.

However, a time difference between sound waves reaching both ears (interaural) from the speakers c and e is actually so small, that the reflected sound can be heard not as being emitted at the position g, but at the respective positions of the speakers c and e. Hence the reproduced sound fails to provide a lateral expanse in sound, so that the listener cannot feel the sound surrounding him as in a hall.

Such an expansion feeling of sound field can be represented by a coefficient of correlation between both ears of the reverberation. The preferred interaural coefficient of correlation has a frequency response as shown in FIG. 7.

Since the right and left audio signals of a stereophonically recorded reverberation is non-correlated, the coefficient of correlation thereof is zero. It is known that when both the audio signals are imparted with a correlation coefficient corresponding to that of a sound at both ears in a diffuse sound field such as a reverberation room, a preferable spacial sound impression can be achieved with only two speakers. Japanese Patent Publication 60-840 discloses a system wherein the correlation coefficient of the recorded reverberation sound is controlled in accordance with the principle so that the reproduced sound gives a spacial impression.

However, since the correlation coefficient value of normalized cross correlation function at zero lag time in the actual hall changes at random during the reverberation, it is difficult to set an optimum interaural correlation coefficient.

SUMMARY OF THE INVENTION

An object of the present invention is to provide a sound field control system where the interaural correlation coefficient is controlled to provide a spacial impression in reproduced sound.

According to the present invention, there is provided a sound field control system for a multi-speaker system having at least two main speakers and reverberation speakers, the system comprising, reverberation signal generating circuit means for generating a plurality of reverberation signals from input audio signals of at least two channels, each of the reverberation signals having a predetermined function of correlation, filter means for controlling the function of correlation of each of the reverberation signals and for applying controlled reverberation signals to the reverberation speakers.

Other objects and features of this invention will become understood from the following description with reference to the accompanying drawings.

DETAILED DESCRIPTION OF THE PREFERRED EMBODIMENTS

Figure 1:
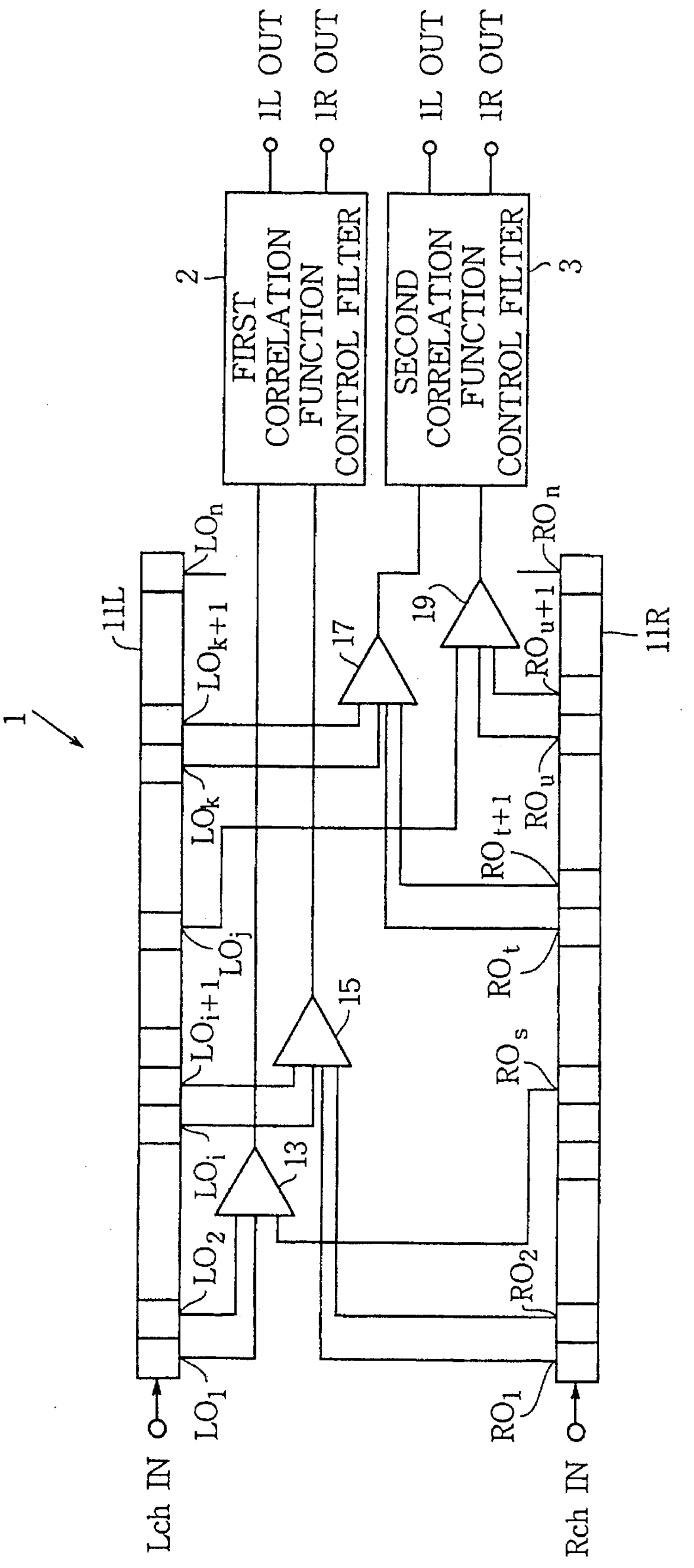
FIG. 1 is a block diagram of a reverberation signal generating circuit provided in a sound field control system of the present invention.

Referring to FIG. 1 showing an example of a reverberation signal generating circuit, a sound field control system according to the present invention has a reverberation signal generating circuit 1 to which left and right channel audio signals are applied. The reverberation signal generating circuit 1 comprises a pair of left and right delay elements 11L and 11R, each having a plurality of output terminals $LO_1$ to $LO_n$, and $RO_1$ to $RO_n$, respectively, so that a plurality of delay times are provided. The delay time becomes longer as the distance between each output terminal and the corresponding input terminal Lch IN or Rch IN becomes longer.

Output terminals $LO_i$ and $LO_2$ of the delay element 11L and an output terminal $R0_5$ of the delay element 11R are connected to an adder 13 so as to generate a first left channel reverberation signal. Output terminals $LO_i$ and $LO_{i+1}$ of the delay element 11L and output terminals $RO_1$ and $R0_2$ are connected to an adder 15 so as to generate a first right channel reverberation signal. Similarly, output terminals $LO_k$ and $LO_{k+1}$ and $RO_t$ and $RO_{t+1}$ are connected to an adder 17 to generate a second left channel reverberation signal. Output terminals $LO_j$, $RO_u$ and $RO_{u+1}$ are connected to an adder 19 to generate a second right channel reverberation signal. Suffixes i, j, k, and s, t, u are set in accordance with the relation of $$1<u<j<k<n,$$

and $$1<a<t<u<n$$

where n is the number of the terminals provided in the delay elements 11R and 11L.

The first left and right channel reverberation signals from the adders 13 and 15, respectively, are fed to a first function of correlation control filter 2, and second left and right channel reverberation signals from the adders 17 and 19, respectively, are fed to a second function of correlation control filter 3.

Figure 2:
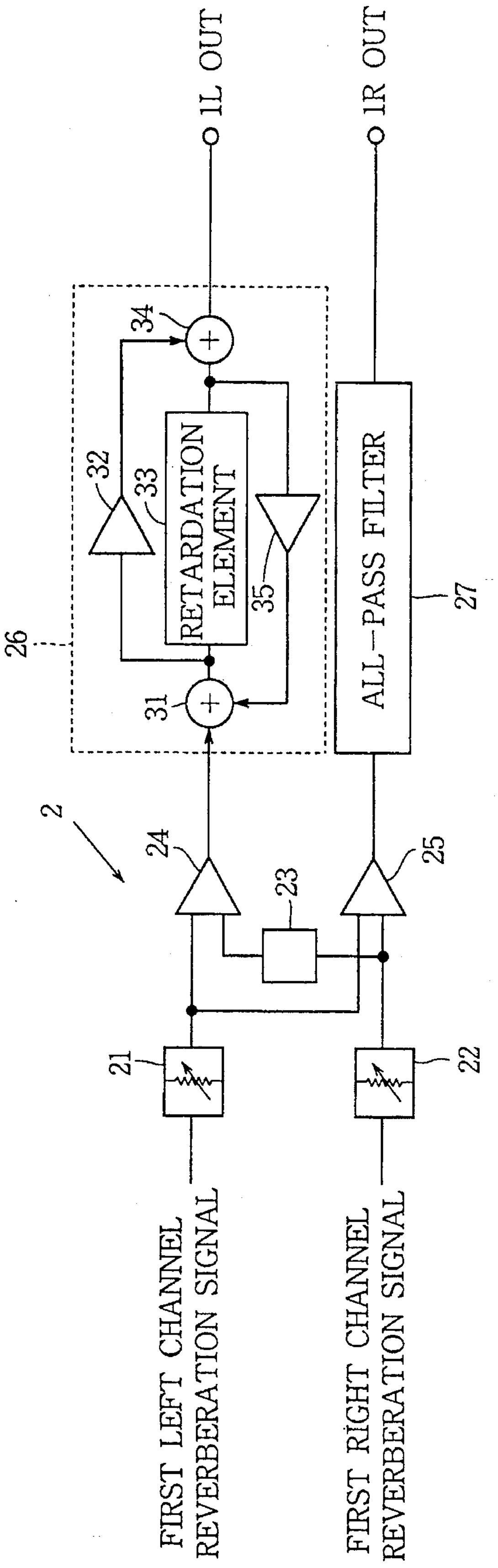
FIG. 2 is a block diagram of a correlation control filter provided in the reverberation signal generating circuit of FIG. 1.

Referring to FIG. 2, the first correlation function control filter 2 comprises a pair of attenuators 21 and 22 which are applied with the first left channel reverberation signal and first right channel reverberation signal, respectively. The output signal of the attenuator 21 is applied to adders 24 and 25. The output signal of the attenuator 22 is applied directly to the adder 25, and also to the adder 24 through an inverter 23. The combined right and left reverberation signals from the adders 24 and 25 are fed to all-pass filters 26 and 27, respectively.

The all-pass filter 26 has a coefficient multiplier 32 where the combined reverberation signal fed through an adder 31 is multiplied by a correlation coefficient. The multiplied signal from the multiplier 32 is fed to an adder 34 to which the combined reverberation signal from the adder 24 is fed through a delay element 33 so as to be added together. The reverberation signal retarded at the delay element 33 is further fed to a coefficient multiplier 35, the output of which is fed to the adder 31 so as to be added to the combined reverberation signal from the adder 24. Thus, a first left channel correlation-controlled reverberation signal is generated at an output terminal 1L OUT.

The all-pass filter 27 has the same construction as that of the filter 26. However, the values of the correlation coefficients in the coefficient multipliers 32 and 35 and the delay time of the delay element 35 are different from each other. Hence the all-pass filter 27 generates a first right channel correlation-controlled reverberation signal at an output terminal 1R OUT.

Referring back to FIG. 1, the second correlation function control filter 3 for generating second left and right channel reverberation signals at respective output terminals 2L OUT and 2R OUT has the same construction as that of the first correlation function control filter 2, so that a further description thereof is omitted.

In operation, the original left and right audio signals are applied to the delay elements 11L and 11R through input terminals Lch IN and Rch IN, respectively, thereby producing reverberation signals. Each of the output terminals $LO_1$ to $LO_n$ and $RO_1$ to $RO_n$ generates an audio signal which is retarded a predetermined time, the delay time differing from those of other audio signals.

The level of the left channel reverberation signal generated from the delayed output signals of the output terminals 1L OUT is attenuated by the attenuator 21 of the first correlation function control filter (FIG. 2). The level of the first right channel reverberation signal generated from the delayed output signals of output terminals 1R OUT is attenuated at the attenuator 22 and inverted by the inverter 23. The output signals of the attenuators 21 and 22 are added at the adder 24 and 25 to produce the combined reverberation signals which are fed to the all-pass filters 26 and 27, respectively. The attenuation levels at the attenuators 21 and 22 are controlled so that the output ratio of the adders changes, thereby changing the correlation of the reverberations.

While passing through the all-pass filter 26 (27), the combined reverberation signal is multiplied by correlation coefficient at the multiplier 35. The produce of the multiplier 32 is added to the combined reverberation signal at the adder 34 to generate the first left (right) correlation-controlled reverberation signal. The second left and right correlation-controlled reverberation signals are generated in the second correlation function control filter 3 in the same manner.

Each of the controlled signals from the filters 2 and 3 are directly fed to the respective speakers through amplifiers. Thus, the reverberation sounds are emitted from the four speakers.

At the reproduction of the reverberation signals, delayed reverberation signals are added to the original reverberation signals, so that the density of the reflected sound represented by the reverberation signals increases, thereby eliminating flutter echo. Since the coefficients and delay times of the filter 26 differ from those in the filter 27, the correlation between reflected sounds differ from one another. Since the interaural correlation is thus controlled, a spacial impression of sound is obtained.

The reverberation signals are directly applied to the amplifiers and speakers when the audio signals are analog signals. In the case where the audio signals are digital, the reverberation signals are converted into analog signals before being applied to the amplifiers and speakers.

As a modification of the filter 2, a filter, which changes the level ratio determined by the attenuators 21 and 22 in accordance with the frequency, can be used in place of attenuators 21 and 22.

Figure 3:
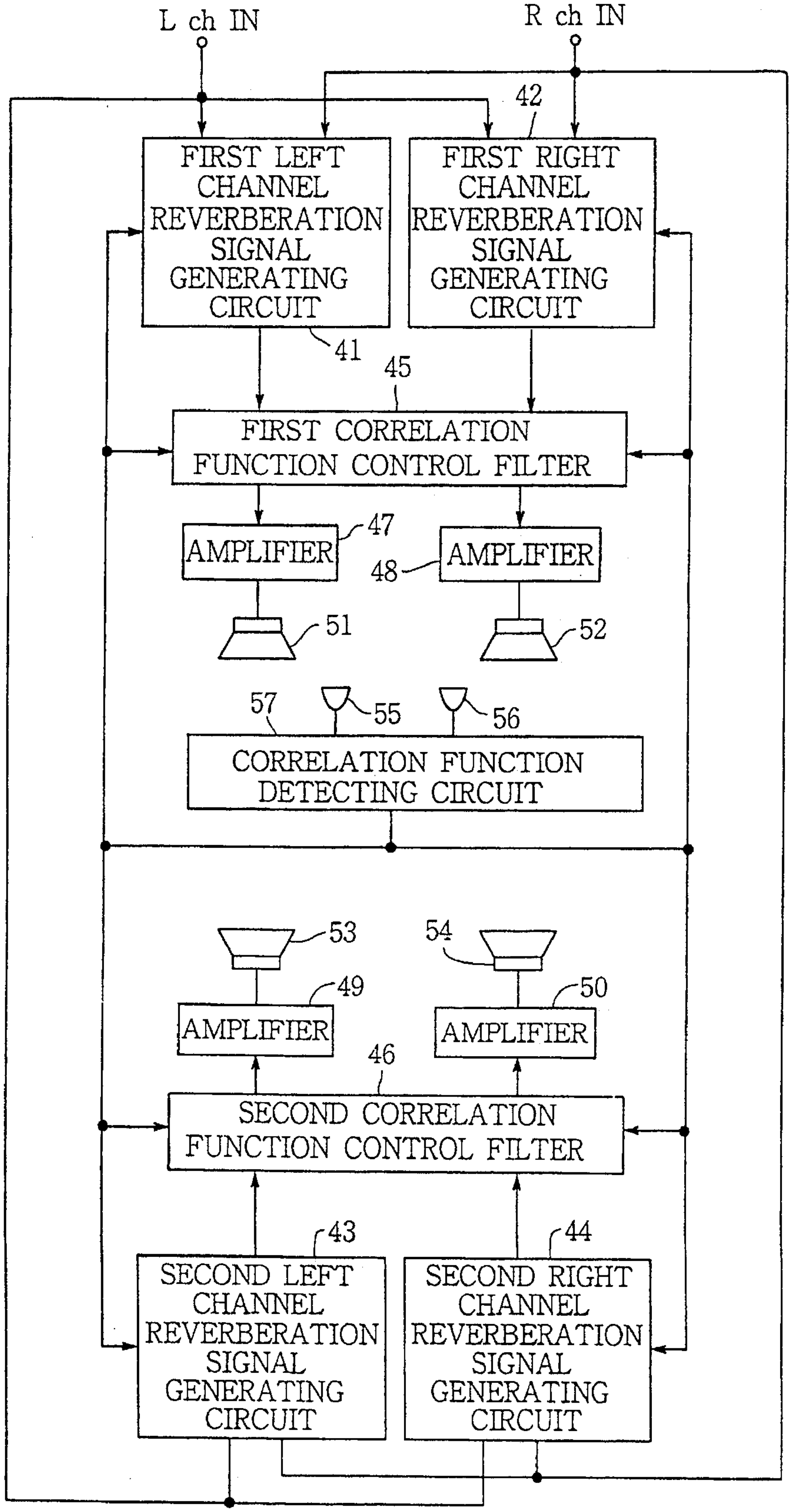
FIG. 3 is a block diagram of a sound field control system of a second embodiment of the present invention.

Referring to FIG. 3, the second embodiment of the sound field control system has four reverberation signal generating circuits 41, 42, 43 and 44. The circuits 41 to 44 correspond to the circuit 1 shown in FIG. 1, and respectively generate first left channel and right channel reverberation signals, and second left channel and right channel reverberation signals. The first left and right channel reverberation signals generated at reverberation signal generating circuits 41 and 42, respectively, are fed to a first correlation function control filter 45 and the second left and right channel reverberation signals generated at the reverberation signal generating circuits 43 and 44, respectively, are fed to a second correlation function control filter 46. Each of the filters 45 and 46 is constructed in the same manner as the correlation function control filter 2 shown in FIG. 2. The outputs of the filters 45 and 46, which are correlation controlled reverberation signals, are applied to corresponding speakers 51, 52, 53 and 54 through the respective amplifiers 47, 48, 49 and 50. The speakers 51 to 54 are positioned around the listener, in front and rear, and at the right and left of him.

The sound field control system of the present embodiment is further provided with a pair of microphones 55 and 56 disposed at the right and left of the listener to pick up the sound reaching the right and left ears of the listener. The output signal of each of the microphones 55 and 56 is fed to a correlation detecting circuit 57 which calculates a correlation function between the two output signals in accordance with a predetermined equation. The calculated correlation function is fed to the correlation function control filters 45 and 46 and to the reverberation signal generating circuits 41 to 44 so as to control the function of the multipliers provided therein and the delay time of the delay elements.

Describing the operation of the present system, the original audio signals and reverberation signals are reproduced in the same manner as in the system of the first embodiment. The diffused sound are collected by the microphones 55 and 56 and fed to the correlation detecting circuit 57. In the correlation detecting circuit 57, the correlation function or an equivalent physical quantity as a correlation value $\Phi$ is calculated, for example, in accordance with the following equation.

$$\Phi = \lim_{T\to\infty} \int_{-T}^{T} M_1(t) \cdot M2(t+\tau)dt \quad (1)$$

where $M_1(t)$ and $M_2(t)$ are output levels of the microphones 55 and 56, respectively, and $\tau$ is a time difference. Since a digital signal processing is actually carried out, correlation value $\Phi$ is represented by a debunching signal, which is expressed as, $$\Phi = \sum_{i,k=0}^{\infty} M_1(i) \cdot M_2(k+l) \quad (2)$$

where l is a time difference.

Figure 4:
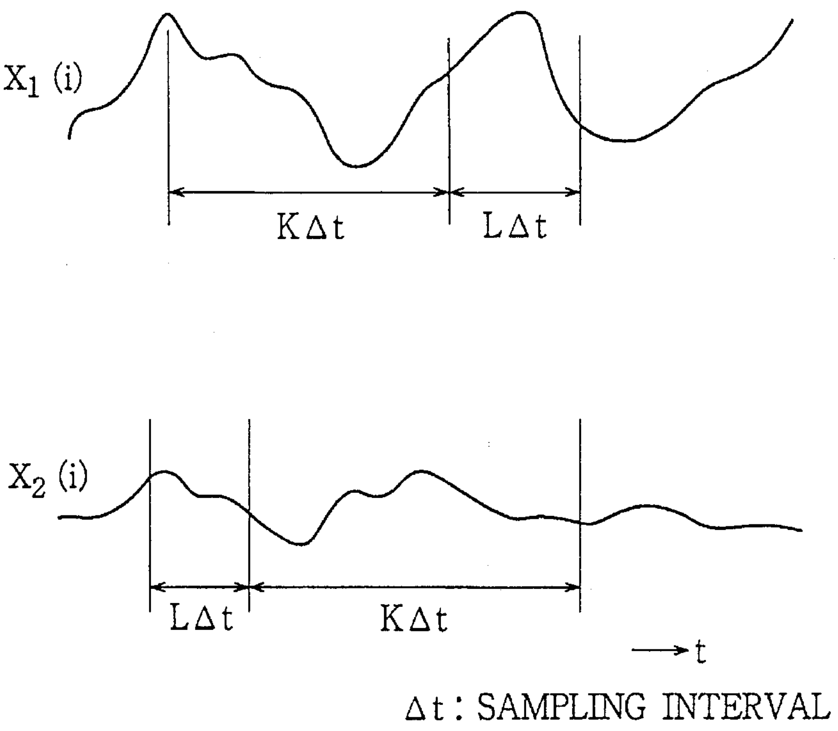
FIG. 4 is a diagram explaining a correlation between two audio signals in the second embodiment.
Figure 5:
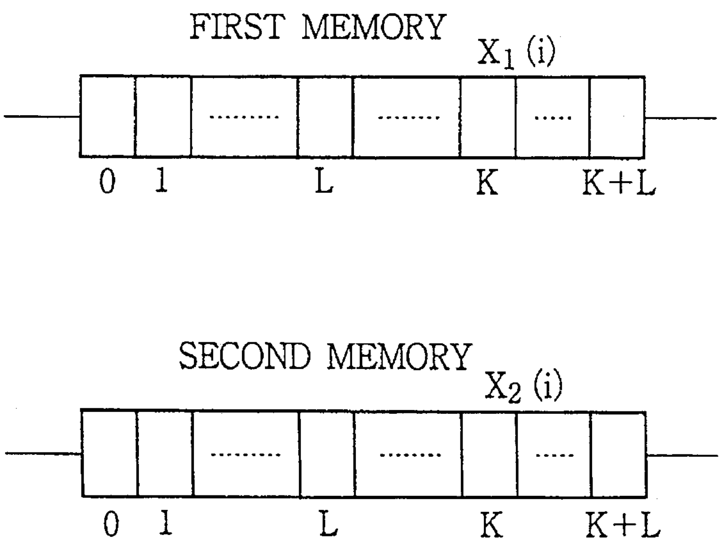
FIG. 5 is a diagram showing first and second memories for storing sampled correlation coefficient in the second embodiment.
Figure 6:
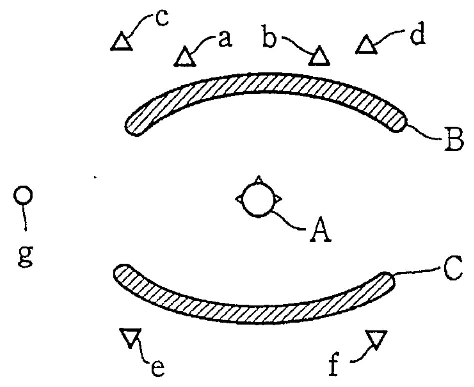
FIG.6 PRIOR ART
FIG. 6 is a schematic diagram showing a conventional sound field control system.
Figure 7:
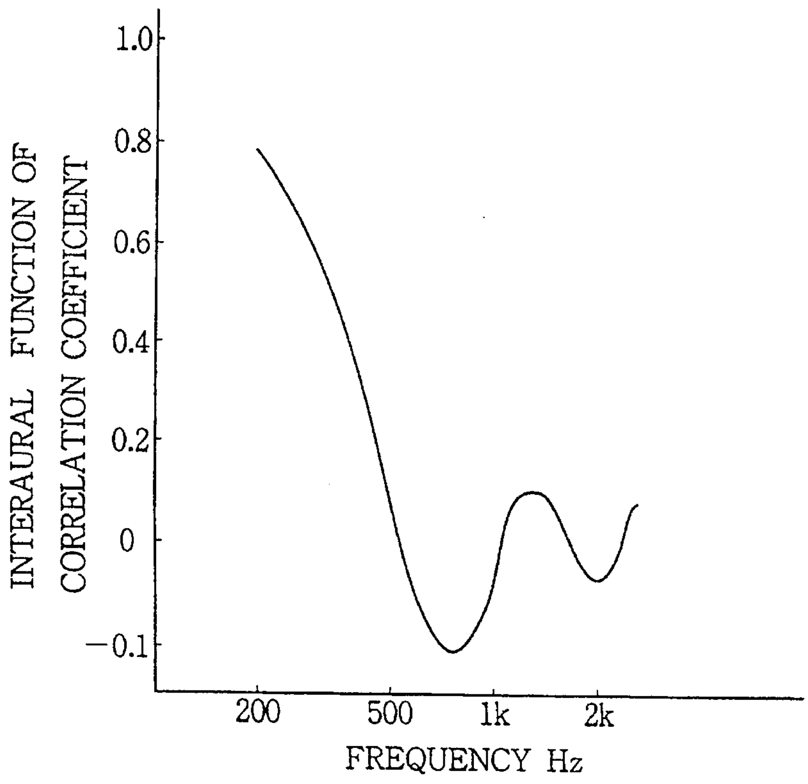
FIG. 7 is a graph showing a frequency response of a correlation coefficient.

Correlation function data $X_1(i)$ and $X_2(i)$ are, for example, sampled at intervals shown in FIG. 4. The products of the sampled data are stored in first and second memories as shown in FIG. 5, and cumulatively added by a DSP, for example, to obtain the correlation value $\Phi$.

More particularly, a correlation value $\Phi(-L)$ is calculated in accordance with, $$\Phi(-L)=X_1(0)\cdot X_2(L)+X_1(0)\cdot X_2(L+1)+\ldots+X_1(K)\cdot X_2K+L)$$

Similarly a correlation value $\Phi(-L+L)$ is calculated in accordance with, $$\Phi(-L+L)=X_1(1)\cdot X_2(L)+X_1(2)\cdot X_2(L+1)\ldots+X_1(K+1)\cdot X_2(K+L)$$

and, a correlation value $\Phi(0)$ is calculated in accordance with, $$\Phi(0)=X_1(L)\cdot X_2(L)+X_1(L+1)\cdot X_2(L+1)+\ldots+X_1(K+L)\cdot X_2(K+L)$$

A correlation value $\Phi(+1)$ is calculated as, $$\Phi(+1)=X_1(L)\cdot X_2(L-1)+X_1(L+1)\cdot x_2(L)+\ldots+X_1(K+L)\cdot X_2(K+L-1)$$

The correlation values $\Phi$ are similarly obtained until a correlation value $\Phi(L)$ is calculated as follows.

$$\Phi(L)=X_1(L)\cdot X_2(0)+X_1(L+1)\cdot X_2(1)+\ldots+X_1(K+L)\cdot X_2(K)$$

Referring to the above equation (2), when using a random noise signal having an erogodic property, which is a property where averages calculated from the data samples over time converge, finite sum of the correlation values $\Phi$ may be calculated as follows.

$$\Phi = \sum_{i,k=0}^{N} M_1(i) \cdot M_2(k+l) \quad (3)$$

In order to obtain the correlation value $\Phi$, the finite sum is calculated a couple of times and the average thereof (set average) is calculated.

In order to control the reverberation signal, the calculated correlation value $\Phi$ is compared with a predetermined initial value. The connections between the output terminals of the delay elements in the reverberation signal generating circuits 41 and 42 with the input terminals of the coefficient multipliers in the correlation control filters 45 and 46 are changed in accordance with the correlation value to render the difference between the predetermined coefficient and calculated correlation value zero. Alternatively, the delay time of the delay elements and coefficients in the coefficient multipliers in the all-pass filters may be adjusted.

From the foregoing it will be understood that the present invention provides a system for controlling a sound field wherein correlations between reverberation signals for generating reverberations imitating those in a concert hall is controlled to comply with an interaural correlation function. Hence, the reproduced sound are imparted with spacial impression.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A sound field control system for a multi-speaker system having at least two main speakers and reverberation speakers, the system comprising:

a reverberation circuit for generating a plurality of reverberation signals from input audio signals of at least two channels, the plurality of reverberation signals having a predetermined function of correlation between each other, the reverberation circuit including a plurality of delay circuits provided for every channel for producing a plurality of retarded audio signals, each of which has a retarded time different from other retarded audio signals, and a plurality of adders for adding a plurality of retarded audio signals to produce the reverberation signals;

filter means including an all-pass filter provided for controlling the function of correlation of each of the reverberation signals to a value corresponding to an interaural correlation coefficient to provide a spatial impression in reproduced sound, and for applying controlled reverberation signals to the reverberation speakers; and at least two microphones for receiving a diffused sound from the speakers, and function detecting circuit means for detecting a function of correlation of the diffused sound and for controlling a characteristic of the filter means.

2. A sound field control system for a multi-speaker system having at least two main speakers and reverberation speakers, the system comprising:

a reverberation circuit for generating a plurality of reverberation signals from input audio signals of at least two channels, the plurality of reverberation signals having a predetermined function of correlation between each other, the reverberation circuit including a plurality of delay circuits provided for every channel for producing a plurality of retarded audio signals, each of which has a retarded time different from other retarded audio signals, and a plurality of adders for adding a plurality of retarded audio signals to produce the reverberation signals;

filter means including an all-pass filter provided for controlling the function of correlation of each of the reverberation signals and for applying controlled reverberation signals to the reverberation speakers, wherein the all-pass filter includes delay element means for retarding the reverberation signal, a multiplier for multiplying the reverberation signal by a coefficient of correlation, and an adder for adding the retarded reverberation signal to an output of the multiplier, and at least two microphones are provided for receiving a diffused sound from the reverberation speakers, and function detecting circuit means is provided for detecting a function of correlation of the diffused sound and for controlling a characteristic of the filter means.

* * * * *